United States Patent
Park et al.

(10) Patent No.: US 10,904,971 B2
(45) Date of Patent: Jan. 26, 2021

(54) OPTICAL APPARATUS USING MULTI-WAVELENGTH LIGHT

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Yeonsang Park, Seoul (KR); Younggeun Roh, Seoul (KR); Heonsu Jeon, Seoul (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/783,888

(22) Filed: Feb. 6, 2020

(65) Prior Publication Data

US 2020/0314983 A1 Oct. 1, 2020

(30) Foreign Application Priority Data

Mar. 29, 2019 (KR) .................. 10-2019-0037062

(51) Int. Cl.
*H05B 45/325* (2020.01)
*H01S 5/026* (2006.01)
*H05B 45/12* (2020.01)

(52) U.S. Cl.
CPC ......... *H05B 45/325* (2020.01); *H01S 5/0262* (2013.01); *H01S 5/0265* (2013.01); *H05B 45/12* (2020.01)

(58) Field of Classification Search
CPC ............. H04L 63/0209; H04L 67/2814; H04L 67/1097; H04L 63/10; H04L 63/083; H04L 67/02; H04L 63/123; H04L 63/0876

USPC ........................................................ 315/152
See application file for complete search history.

(56) References Cited

U.S. PATENT DOCUMENTS

| | | | |
|---|---|---|---|
| 6,958,729 B1 | 10/2005 | Metz | |
| 8,045,157 B2 | 10/2011 | Shibayama et al. | |
| 8,138,667 B2 * | 3/2012 | Yamazaki | H01L 27/3211 |
| | | | 313/504 |
| 9,702,685 B2 | 7/2017 | Kim et al. | |
| 2008/0074660 A1 | 3/2008 | Ye et al. | |

(Continued)

FOREIGN PATENT DOCUMENTS

JP          5903700 B2    4/2016
KR   10-2015-0054542 A    5/2015

(Continued)

OTHER PUBLICATIONS

Ian Coddington et al., "Dual-comb spectroscopy", Optica, vol. 3, No. 4, Apr. 2016, pp. 414-426 (13 pages total).

(Continued)

*Primary Examiner* — Don P Le
(74) *Attorney, Agent, or Firm* — Sughrue Mion, PLLC

(57) ABSTRACT

An optical apparatus using multi-wavelength light, includes a substrate, and a light emitting array disposed on the substrate, and comprising a plurality of light emitting devices emitting a plurality of lights having different wavelengths. The optical apparatus includes a controller configured to control the light emitting array such that the plurality of lights are modulated differently and emitted simultaneously.

25 Claims, 9 Drawing Sheets

(56) References Cited

U.S. PATENT DOCUMENTS

| | | | |
|---|---|---|---|
| 2009/0306487 A1* | 12/2009 | Crowe | A61B 5/14551 600/322 |
| 2010/0053755 A1 | 3/2010 | Lee et al. | |
| 2010/0097613 A1 | 4/2010 | Saari | |
| 2010/0208261 A1 | 8/2010 | Sens et al. | |
| 2012/0262782 A1* | 10/2012 | Lee | F21V 9/00 359/385 |
| 2013/0062645 A1* | 3/2013 | Lee | H01L 33/507 257/98 |
| 2013/0265568 A1* | 10/2013 | Micheels | G01J 3/0216 356/51 |
| 2014/0061486 A1 | 3/2014 | Bao et al. | |
| 2016/0057825 A1* | 2/2016 | Hu | H05B 45/10 315/201 |
| 2016/0278704 A1* | 9/2016 | Park | A61B 5/02 |
| 2017/0256909 A1 | 9/2017 | Braddell et al. | |
| 2017/0336263 A1* | 11/2017 | Hayashi | G01J 3/0289 |
| 2018/0059026 A1 | 3/2018 | Ye et al. | |
| 2018/0132766 A1* | 5/2018 | Lee | G01N 21/474 |
| 2018/0196313 A1* | 7/2018 | Kang | G02B 5/201 |
| 2018/0270474 A1* | 9/2018 | Liu | A61B 6/508 |
| 2019/0049296 A1 | 2/2019 | Cho et al. | |
| 2019/0086259 A1 | 3/2019 | Cho | |
| 2019/0155124 A1 | 5/2019 | Park | |
| 2019/0189835 A1* | 6/2019 | Dussaigne | H01L 33/007 |
| 2019/0277693 A1 | 9/2019 | Kim et al. | |

FOREIGN PATENT DOCUMENTS

| | | |
|---|---|---|
| KR | 10-2016-0102873 A | 8/2016 |
| KR | 10-2017-0135019 A | 12/2017 |

OTHER PUBLICATIONS

Communication dated Jul. 23, 2020 issued by the European Intellectual Property Office in counterpart European Application No. 20155598.4.

* cited by examiner

141a

OPTICAL APPARATUS USING MULTI-WAVELENGTH LIGHT

CROSS-REFERENCE TO RELATED APPLICATION

This application is based on and claims priority under 35 U.S.C. § 119 to Korean Patent Application No. 10-2019-0037062, filed on Mar. 29, 2019, in the Korean Intellectual Property Office, the disclosure of which is incorporated by reference herein in its entirety.

BACKGROUND

1. Field

The disclosure relates to an optical apparatus using multi-wavelength light and an operation method thereof, and more particularly, to an optical apparatus including a plurality of light emitting devices having different wavelengths and an operation method thereof.

2. Description of the Related Art

Spectroscopes are one of the most important optics in the field of optics. Spectroscopes of the related art include various optical devices, which are bulky and heavy. Recently, with the miniaturization of related applications such as smart phones and wearable devices, miniaturization of spectroscopes is required.

Such a spectroscope may be implemented as an independent apparatus, but may be a component of another apparatus. In particular, research on a spectroscope mounted on a mobile device such as a mobile phone is ongoing.

SUMMARY

Provided are an optical apparatus for obtaining a physical property of a target object and an operation method thereof.

Further provided are an optical apparatus for obtaining information about a target object by using a plurality of light emitting devices having different wavelengths and an operation method thereof.

Additional aspects will be set forth in part in the description that follows and, in part, will be apparent from the description, or may be learned by practice of the presented embodiments.

According to embodiments, an optical apparatus using multi-wavelength light, includes a substrate, and a light emitting array disposed on the substrate, and comprising a plurality of light emitting devices emitting a plurality of lights having different wavelengths. The optical apparatus further includes a controller configured to control the light emitting array such that the plurality of lights are modulated differently and emitted simultaneously.

The controller may be further configured to modulate a waveform of a driving signal that is applied to the plurality of light emitting devices such that the plurality of lights having different waveforms are emitted.

Any one or any combination of a frequency, an amplitude, and a phase of the driving signal may be modulated.

The waveform of the driving signal may include any one or any combination of a sine wave, a square wave, a triangle wave, and a pulse wave.

A first waveform correlation of first ones among the plurality of lights emitted from at least two among the plurality of light emitting devices that are adjacent to each other in the light emitting array may be greater than a second waveform correlation of second ones among the plurality of lights emitted from at least two among the plurality of light emitting devices that are not adjacent to each other.

A first waveform correlation of first ones among the plurality of lights emitted from at least two among the plurality of light emitting devices that are adjacent to each other in the light emitting array may be smaller than a second waveform correlation of second ones among the plurality of lights emitted from at least two among the plurality of light emitting devices that are not adjacent to each other.

The plurality of light emitting devices may be two-dimensionally arranged on the substrate.

The plurality of light emitting devices may be sequentially arranged in a first direction in the light emitting array, and emit the plurality of lights having sequentially changing wavelengths.

Each of the plurality of lights may have a wavelength band of less than about 15 nm.

An interval between central wavelengths of at least two among the plurality of lights emitted by at least two among the plurality of light emitting devices that are adjacent to each other in the light emitting array may be greater than or equal to about 0.5 nm and less than or equal to about 30 nm.

Any one or any combination of the plurality of light emitting devices may be a laser or a light emitting diode (LED).

Any one or any combination of the plurality of light emitting devices may include an active layer disposed on the substrate and configured to generate light, and a wavelength determining layer configured to emit one among the plurality of lights having one among the different wavelengths in the light generated by the active layer.

The one among the different wavelengths may correspond to either one or both of a thickness and a dielectric constant of the wavelength determining layer.

The active layer may be disposed in the wavelength determining layer.

The wavelength determining layer may include a grating pattern structure.

The wavelength determining layer may include a plurality of dielectric layers that are spaced apart from each other in a longitudinal direction of the substrate.

A pitch of the plurality of dielectric layers may continuously change in the longitudinal direction of the substrate.

The plurality of dielectric layers may include first dielectric layers arranged in a first pitch, and second dielectric layers arranged in a second pitch different from the first pitch.

The light emitting array may include an active layer disposed on the substrate and configured to generate light, and a plurality of wavelength conversion layers disposed on the active layer and configured to emit the light generated by the active layer as the plurality of lights having the different wavelengths.

The optical apparatus may further include a barrier disposed on the active layer and configured to separate the plurality of wavelength conversion layers.

The optical apparatus may further include a light detector configured to detect light that is at least one among scattered, transmitted and reflected by a target object to which the plurality of lights are emitted by the light emitting array, and a processor configured to obtain information about the target object, using the light detected by the light detector.

The light detector may include an image sensor.

The processor may be further configured to classify the light detected by the light detector for each wavelength of the plurality of lights emitted by the light emitting array, and obtain the information about the target object, using the classified light for each wavelength.

According to embodiments, an operation method of an optical apparatus comprising a plurality of light emitting devices, includes emitting, by the plurality of light emitting devices, a plurality of lights having different wavelengths and modulations, and detecting light that is at least one among scattered, reflected and transmitted by a target object to which the plurality of lights are emitted by the plurality of light emitting devices. The operation method further includes classifying the detected light for each wavelength, based on the modulations of the plurality of lights, and obtaining information about the target object, using the classified light for each wavelength.

Each of the plurality of lights may have a wavelength band of less than about 15 nm.

An interval between central wavelengths of at least two among the plurality of lights emitted by at least two among the plurality of light emitting devices that are adjacent to each other may be greater than or equal to about 0.5 nm and less than or equal to about 30 nm.

According to embodiments, an optical apparatus includes a substrate, an active layer disposed on the substrate and configured to generate a first light, and a wavelength determining layer disposed on the active layer and comprising a first portion configured to emit a second light having a first wavelength in the first light generated by the active layer, and a second portion configured to emit a third light having a second wavelength in the first light generated by the active layer.

A first refractive index of the first portion of the wavelength determining layer may be different than a second refractive index of the second portion of the wavelength determining layer.

A first thickness of the first portion of the wavelength determining layer may be different than a second thickness of the second portion of the wavelength determining layer.

The first portion of the wavelength determining layer may include first dielectric layers that are spaced apart from each other in a longitudinal direction of the substrate, the second portion of the wavelength determining layer may include second dielectric layers that are spaced apart from each other in the longitudinal direction of the substrate, and a first pitch of the first dielectric layers may be different than a second pitch of the second dielectric layers.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
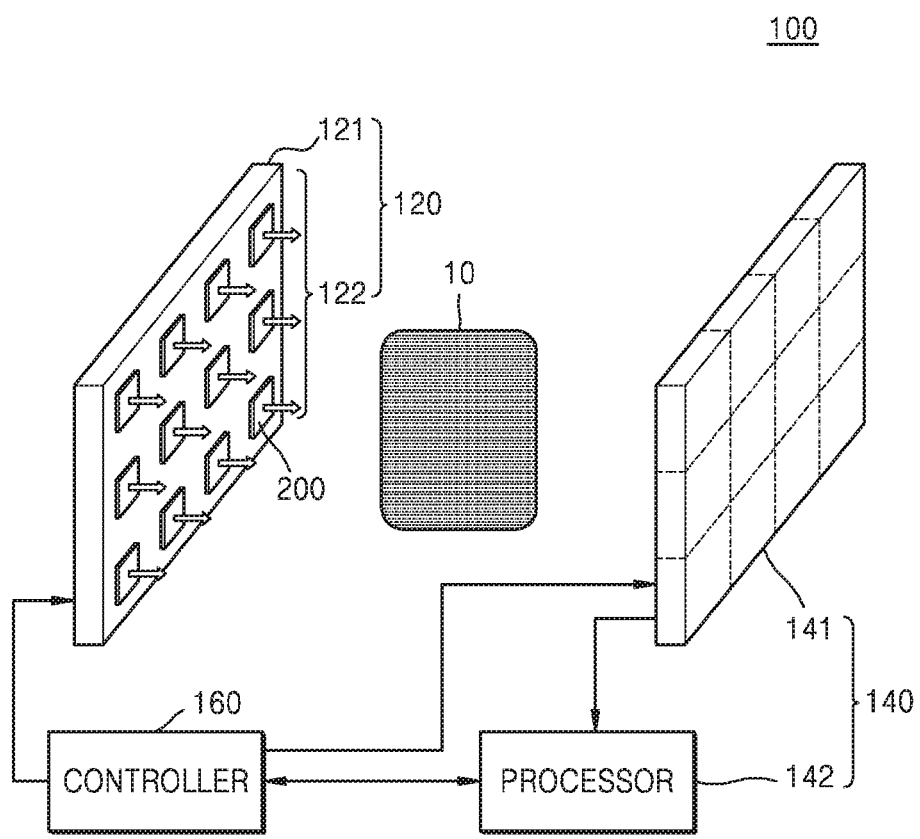
FIG. 1 is a diagram schematically showing an optical apparatus using multi-wavelength light, according to embodiments.

Reference will now be made in detail to embodiments, examples of which are illustrated in the accompanying drawings, wherein like reference numerals refer to like elements throughout. In this regard, the present embodiments may have different forms and may not be construed as being limited to the descriptions set forth herein. Accordingly, the embodiments are described below, by referring to the figures, to explain aspects. Expressions such as "at least one of," when preceding a list of elements, modify the entire list of elements and do not modify the individual elements of the list.

Hereinafter, an optical apparatus using multi-wavelength light and an operation method thereof according to embodiments will be described with reference to the accompanying drawings. The width and thickness of layers or regions illustrated in the accompanying drawings may be somewhat exaggerated for clarity and ease of description. Like reference numerals designate like elements throughout the specification.

As used in the embodiments, terms such as "include," "have," etc. may not be construed as including all components or operations described in the embodiments. It may be understood that some of these components or operations may not be included or additional components or operations may be further included.

In the following, what is described as "upper" or "on" may include not only those in contact with and directly above, below, left, and right but also those in non-contact with and directly above, below, left, and right. Hereinafter, embodiments will be described in detail with reference to the accompanying drawings.

Although the terms "first," "second," etc., may be used herein to describe various components, these components may not be limited by these terms. These terms are only used to distinguish one component from another component.

As used herein, the terms "unit," "module," etc. may be understood as units for processing at least one function or operation and may be embodied as hardware, software, or a combination thereof.

FIG. 1 is a diagram schematically showing an optical apparatus 100 using multi-wavelength light, according to embodiments. As shown in FIG. 1, the optical apparatus 100 according to embodiments may include a light transmitting end 120 that emits a plurality of lights having different wavelengths to a target object 10, a light receiving end 140 that receives light reflected, scattered, or transmitted through the target object 10 to obtain information about the target body 10, and a controller 160 that controls the light transmitting end 120 and the light receiving end 140.

The light transmitting end 120 may include a substrate 121 and a light emitting array 122 that is monolithically disposed on the substrate 121 and includes a plurality of light emitting devices 200 that emit light of different wavelengths.

The substrate 121 may include a substrate for growing the light emitting device 200. The substrate 121 may include various materials used in general semiconductor processing. For example, the substrate 121 may for example, include a silicon substrate or a sapphire substrate. However, this is an example and the substrate 121 may include various other materials.

The light emitting array 122 may include the plurality of light emitting devices 200 that emit light of different wavelengths. Each of the light emitting devices 200 may be arranged monolithically on the substrate 121. That is, the light emitting device 200 may be formed integrally with the substrate 121 by being laminated or patterned on the substrate 121 by semiconductor processing. The plurality of light emitting devices 200 may be spatially spaced and arranged on the substrate 121, and some layers may be connected to each other.

Each of the light emitting devices 200 may emit light having a narrow wavelength bandwidth, and an interval between central wavelengths of the light emitting devices 200 may be greater than the wavelength bandwidth. Thus, the light emitted from the light emitting array 122 may be discontinuous light, for example, comb-type light. For example, each of the light emitting devices 200 may emit light having a bandwidth of less than about 15 nm, and the interval between the central wavelengths may be greater than or equal to about 0.5 nm and less than or equal to about 30 nm.

Each of the light emitting devices 200 may include a laser or a light emitting diode (LED) and is not limited to a specific example. The light source 110 may be a vertical cavity (C) surface-emitting laser diode (VCSEL), a distributed feedback laser, a laser diode, an LED, a resonance cavity LED, or the like.

Alternatively, the light emitting device 200 may include a tunable laser capable of providing light of different wavelengths. The laser may have a range of a narrow bandwidth and a wide wavelength tuning. Then, a single tunable laser may output a large number of lights having different wavelengths. The tunable laser may output light of different wavelengths according to an electrical signal, and the tuning of wavelength may be continuous or discontinuous. Alternatively, each of the light emitting devices 200 may be an LED having a narrow bandwidth.

The plurality of light emitting devices 200 may be arranged one-dimensionally or two-dimensionally as shown in FIG. 1. The plurality of light emitting devices 200 may be arranged in an m×n matrix, where m and n are natural numbers of 2 or more. The plurality of light emitting devices 200 may be arranged such that the wavelengths sequentially change in one direction. However, the plurality of light emitting devices 200 are not limited thereto.

Figure 2:
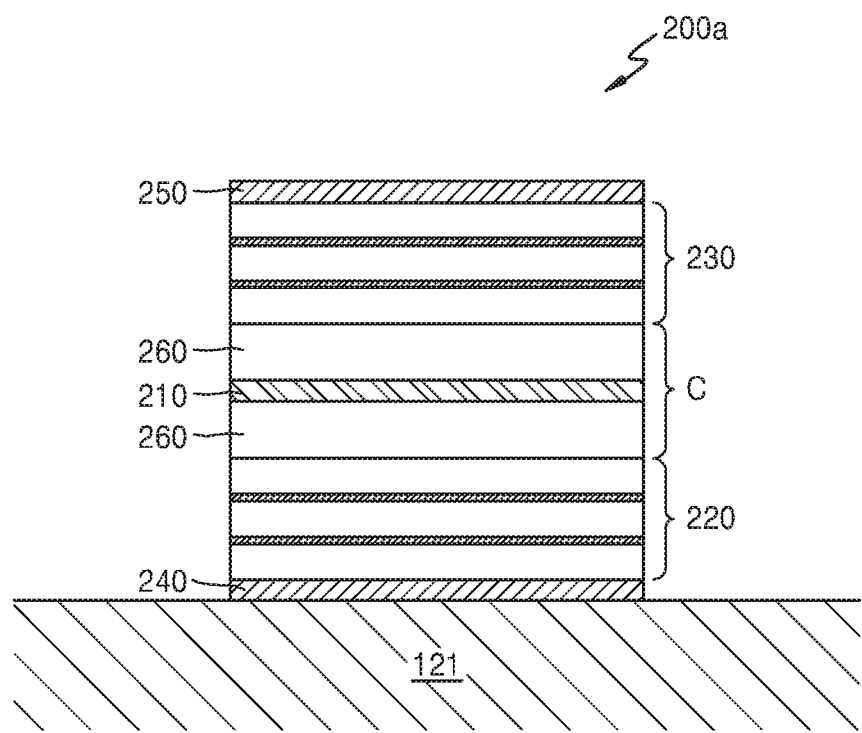
FIG. 2 is a diagram illustrating an example of a light emitting device according to embodiments.

FIG. 2 is a diagram illustrating an example of a light emitting device 200a according to embodiments. As shown in FIG. 2, the light emitting device 200a may include an active layer 210 that generates light, first and second reflective layers 220 and 230 that are apart from each other with the active layer 210 therebetween to form a resonance cavity C, and first and second electrodes 240 and 250 disposed on the first and second reflective layers 220 and 230, respectively. The light emitting device 200a may emit light having a wavelength that resonates in the resonance cavity C from the light generated in the active layer 210.

The active layer 210 generates light by a driving signal (i.e., an electrical signal) applied to the first and second electrodes 240 and 250. The active layer 210 may include a quantum well structure that combines electrons and holes to generate light. The active layer 210 may be made of a III/V compound semiconductor made of Group III and Group V materials. The active layer 210 may include a resonant periodic gain (RPG) structure composed of a plurality of quantum well layers and barrier layers between the quantum well layers.

Quantum well layers and barrier layers are arranged in a multi-layer structure alternating with each other. Here, as the quantum well layer, a semiconductor material such as InxGa1-xAsyP1-y, InxGa1-xAs, InxGa1-xNyAs1-y, InxGa1-xAsySb (where $0.0 < x < 1.0$, $0.0 < y < 1.0$), etc. may be used. Values of x and y may be selected individually for each quantum well layer. A quantum dot of In(Ga)(N)As may be used instead of the quantum well layer.

The first and second reflective layers 220 and 230 reflect the light generated in the active layer 210 to the resonance cavity C such that the light may resonate in the resonance cavity C. The first and second reflective layers 220 and 230 may include a distributed Bragg reflector (DBR) structure designed to have a high reflectivity at a resonant wavelength. The first and second reflective layers 220 and 230 may have the same reflectivity of approximately 50%. The first and second reflective layers 220 and 230 may include a multi-band distributed brag reflector in which, for example, a plurality of different layers are periodically and continuously arranged in a predetermined order. Each of the first and second reflective layers 220 and 230 is configured by arranging a high refractive index layer H and a low refractive index layer L in a predetermined order. Here, the high refractive index layer H includes AlxGa1-xAs($0 \leq x < 1$), preferably GaAs (that is, x=0). On the other hand, the low refractive index layer L includes AlyGa1-yAs($0 < y \leq 1$), preferably AlAs (i.e., y=1).

The first electrode 240 may include an n-type doped semiconductor layer, and the second electrode 250 may include a p-type doped semiconductor layer. A driving signal is applied to the first and second electrodes 240 and 250 such that the active layer 210 is excited to generate light. The generated light may reciprocate the active layer 210 while repeating reflection between the first and second reflective layers 220 and 230, and the light resonated in the resonance cavity C from the amplified light may be emitted to the outside.

The remaining space of the cavity C may be filled with a material transparent to the light emitted from the active layer 210 and may determine the effective permittivity of the resonance cavity C, and thus may be referred to as a wavelength determining layer 260. The active layer 210 and, the first and second reflective layers 220 and 230 may be formed of a material capable of emitting or reflecting light having a relatively wide wavelength. On the other hand, the light emitting device 200a may amplify and emit light of a wavelength having a narrow wavelength band by a resonance condition of the resonance cavity C. The light emitted from the light emitting device 200a may be determined by the resonance wavelength of the resonance cavity C, the resonance wavelength may be determined by a resonance length, and the resonance length may be determined by a width w of the resonance cavity C and the effective permittivity of the resonance cavity C, etc. The width of the resonance cavity C may be determined by a thickness of the wavelength determining layer 260, and the effective permittivity in the resonance cavity C may vary according to a refractive index or dielectric constant of the wavelength determining layer 260. Therefore, by changing either one or both of the refractive index and the thickness of the wavelength determining layer 260, a light path in the resonance cavity C may be changed such that the resonance wavelength may be changed.

The wavelength determining layer 260 may include semiconductor material such as $In_xGa_{1-x}As_yP_{1-y}$, $In_xGa_{1-x}As$, $In_xGa_{1-x}N_yAs_{1-y}$, $In_xGa_{1-x}As_ySb$, $Al_xGa_{1-x}As$, where $0.0<x<1.0$, $0.0<y<1.0$.

Figure 3:
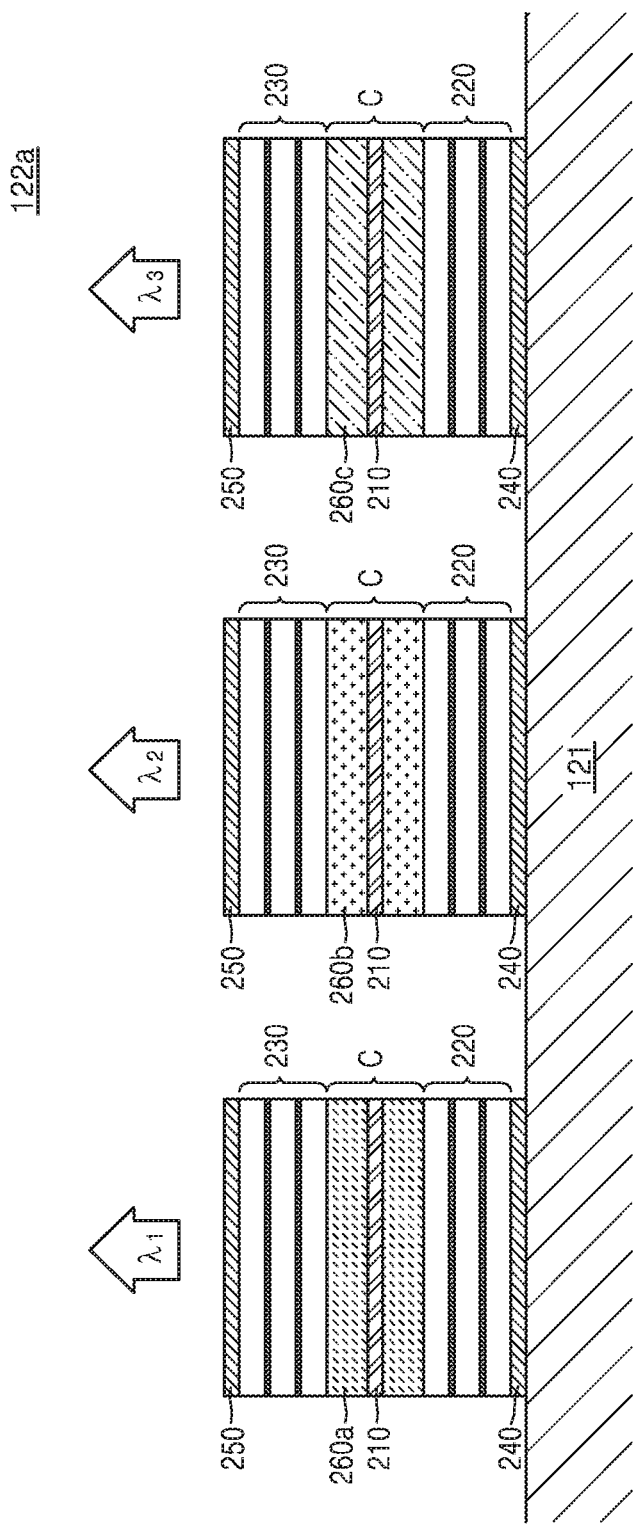
FIG. 3 is a diagram illustrating an example of a light emitting array that emits light having different wavelengths for each effective permittivity, according to embodiments.

FIG. 3 is a diagram illustrating a light emitting array 122a as an example of the light emitting array 122 that emits light having different wavelengths for each effective permittivity, according to embodiments. As shown in FIG. 3, the light emitting device 200 may allow the resonance cavity C to have a different effective permittivity. For example, wavelength determining layers 260a, 260b, and 260c of the respective light emitting devices 200 may include different materials. Thus, a wavelength $\lambda_1$, $\lambda_2$ or $\lambda_3$ of light emitted from each light emitting device 200 may vary.

The wavelength determining layers 260a, 260b, and 260c may include semiconductor material such as $In_xGa_{1-x}As_yP_{1-y}$, $In_xGa_{1-x}As$, $In_xGa_{1-x}N_yAs_{1-y}$, $In_xGa_{1-x}As_ySb$, $Al_xGa_{1-x}As$, where $0.0<x<1.0$, $0.0<y<1.0$. A composition ratio (e.g., x and y values of $In_xGa_{1-x}As_yP_{1-y}$) of the semiconductor material may be adjusted to have different refractive indices and dielectric constants.

Figure 4:
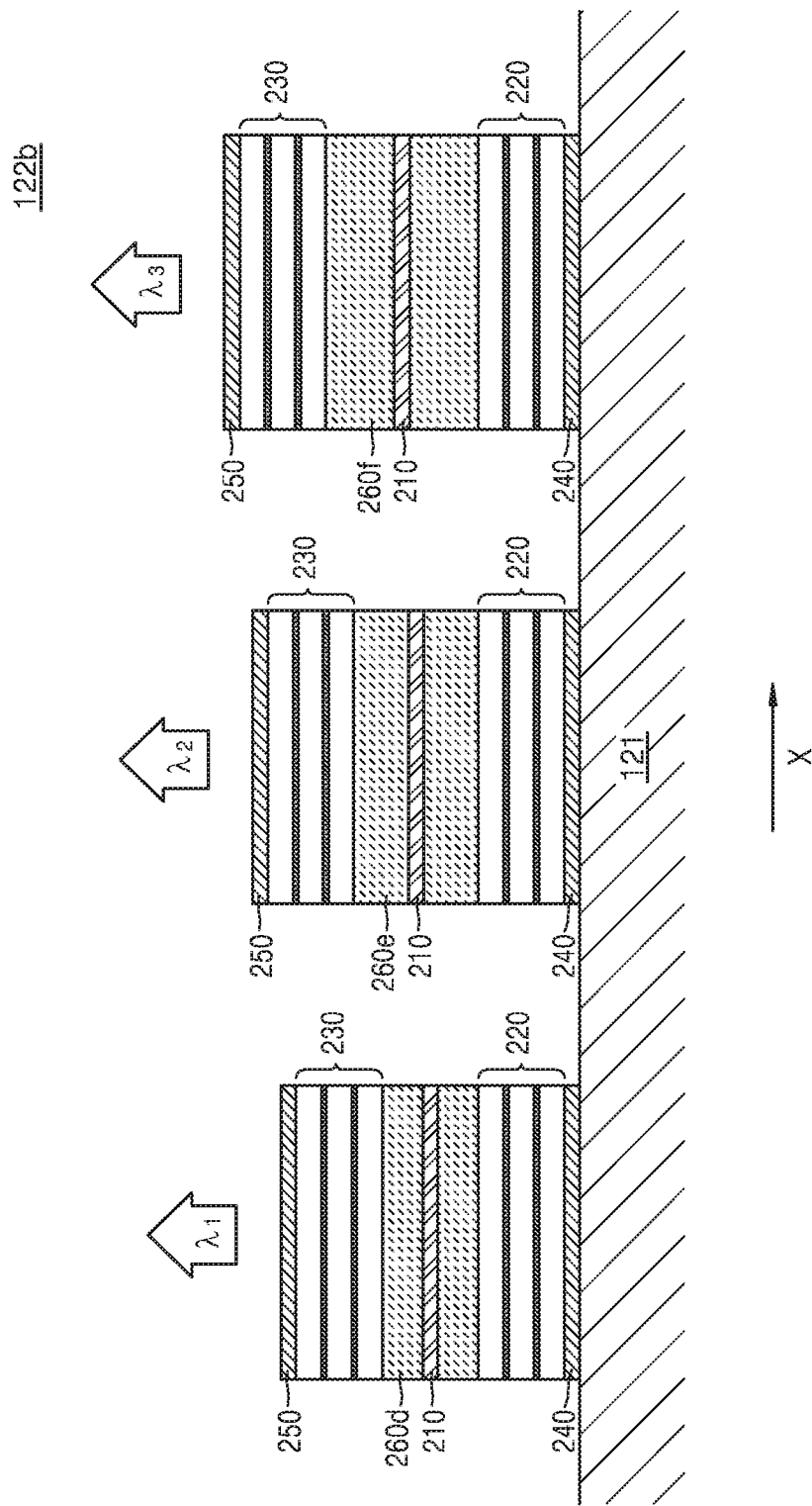
FIG. 4 is a diagram illustrating an example of a light emitting array that emits light of different wavelengths according to a thickness of a wavelength determining layer, according to embodiments.

FIG. 4 is a diagram illustrating a light emitting array 122b as an example of the light emitting array 122 that emits light of different wavelengths according to a length of the resonance cavity C, according to embodiments. As shown in FIG. 4, thicknesses of wavelength determining layers 260d, 260e, and 260f of the light emitting devices 200 respectively may be different from each other such that a resonance wavelength $\lambda_1$, $\lambda_2$ or $\lambda_3$ may be different. For example, the light emitting devices 200 may be arranged such that the thicknesses of the wavelength determining layers 260d, 260e, and 260f increase in a first direction X. Then, each light emitting device 200 may emit light having a larger wavelength $\lambda_1$, $\lambda_2$ or $\lambda_3$ in the first direction X.

The wavelength determining layers 260d, 260e, and 260f may include semiconductor material such as $In_xGa_{1-x}As_yP_{1-y}$, $In_xGa_{1-x}As$, $In_xGa_{1-x}N_yAs_{1-y}$, $In_xGa_{1-x}As_ySb$, $Al_xGa_{1-x}As$, where $0.0<x<1.0$, $0.0<y<1.0$. A thickness of each of the wavelength determining layers 260d, 260e, and 260f may be adjusted according to a deposition method.

Figure 5:
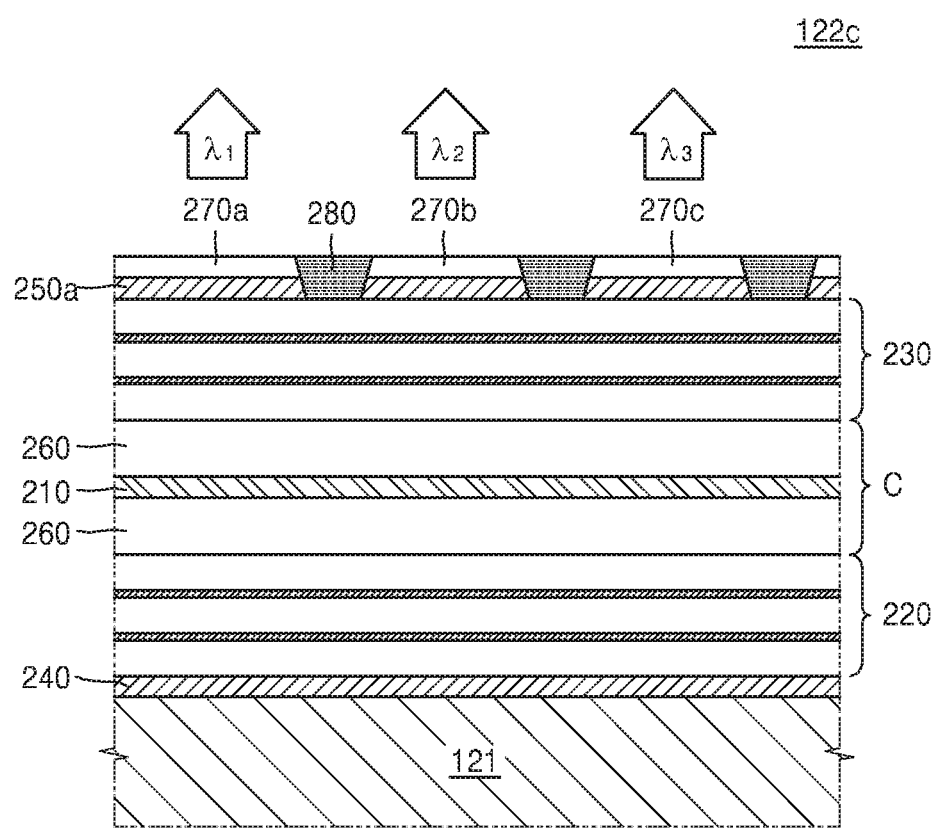
FIG. 5 is a diagram illustrating an example of a light emitting array including different wavelength conversion layers, according to embodiments

FIG. 5 is a diagram illustrating an example of a light emitting array 122c including different wavelength conversion layers 270a, 270b, and 270c, according to embodiments. As shown in FIG. 5, the wavelength conversion layers 270a, 270b, and 270c may be further disposed on a second electrode 250a. Each of the wavelength conversion layers 270a, 270b, and 270c may differently convert the magnitude of wavelength $\lambda_1$, $\lambda_2$ or $\lambda_3$ of light resonated in the active layer 210. Materials of the wavelength conversion layers 270a, 270b, and 270c may be different such that each light emitting device may emit light having a different wavelength $\lambda_1$, $\lambda_2$ or $\lambda_3$. The wavelength conversion layers 270a, 270b, and 270c may include quantum dots (QDs) of a predetermined size, which are excited by the light emitted from the active layer 210 and emit light of a predetermined wavelength $\lambda_1$, $\lambda_2$ or $\lambda_3$, and fluorescent layers 292. The quantum dot QD may have a core-shell structure having a core portion and a shell portion, and may also have a shell-free particle structure. The quantum dot QD may include any one or any combination of, for example, a Group II-VI series semiconductor, a Group III-V series semiconductor, a Group IV-VI series semiconductor, a Group IV series semiconductor, and a graphene quantum dot. As an example, the quantum dot QD may include any one or any combination of Cd, Se, Zn, S and InP, but is not limited thereto. The wavelength conversion layers 270a, 270b, and 270c may use the quantum dots having different light emission wavelengths by different sizes, or the fluorescent layers 292 having different light emission wavelengths by different material properties.

A plurality of light emitting devices may be divided by the wavelength conversion layers 270a, 270b, and 270c and may share the active layer 210, the first and second reflective layers 220 and 230, the first electrode 240, and the wavelength determining layer 260. Because the resonance cavity C, the active layer 210, the first and second reflective layers 220 and 230, the first electrode 240, and the wavelength determining layer 260 are shared, manufacturing of the light emitting array 122c may be easy. Further, the light emitting array 122c may further include barrier 280 partitioning the light emitting devices. The barrier 280 may be disposed between the wavelength conversion layers 270a, 270b, and 270c and may have a mesh structure. The barrier 280 may have a tapered shape that narrows from an upper region to a lower region thereof. The barrier 280 of the tapered shape may increase discontinuity of lights emitted from the light emitting devices 200 to reduce noise. The barrier 280 may include any one or any combination of a black matrix material, a resin, and a polymer. Second electrodes 250a may also be separated in the unit of a light emitting device.

In FIG. 5, the wavelengths Ai, $\lambda_2$ and $\lambda_3$ of the emitted light by the materials of the wavelength conversion layers 270a, 270b, and 270c are changed, but are not limited thereto. The wavelengths Ai, $\lambda_2$ and $\lambda_3$ of the emitted light may be changed by a pattern structure.

Figure 6:
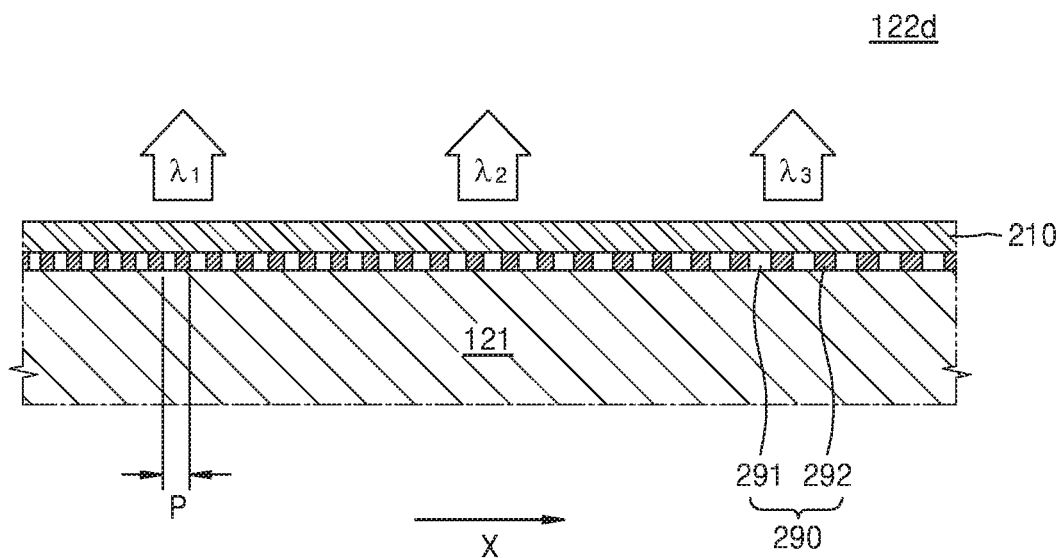
FIG. 6 is a diagram showing an example of a light emitting array including a pattern structure, according to embodiments.

FIG. 6 is a diagram showing an example of a light emitting array 122d including a pattern structure, according to embodiments. As shown in FIG. 6, the light emitting array 122d may include the substrate 121, a wavelength determining layer 290 disposed on the substrate 121 and the active layer 210 disposed on the wavelength determining layer 290. The substrate 121 may include any one or any combination of, for example, quarts, silicon dioxide ($SiO_2$), and sapphire ($Al_2O_3$).

The wavelength determining layer 290 may have a grating pattern structure. The wavelength determining layer 290 may include dielectric layers 291 spaced and disposed on the substrate 121. The fluorescent layers 292 may be filled between the dielectric layers 291. Thus, the dielectric layers 291 and the fluorescent layers 292 may be alternately arranged in a longitudinal direction X of the substrate 121. The dielectric layers 291 may be arranged such that a pitch P of the dielectric layers 291 continuously changes in the longitudinal direction X of the substrate 121.

The dielectric layer 291 may include, for example, nitride or oxide. The nitride may include, for example, silicon nitride ($Si_3N_4$) or gallium nitride (GaN). The oxide may include any one or any combination of, for example, titanium oxide ($TiO_2$), zirconium oxide ($ZrO_2$), and yttria ($Y_2O_3$).

The fluorescent layer 292 may include any one or any combination of, for example, a quantum dot QD, a ceramic fluorescent material, and an organic dye. The quantum dot QD may include any one or any combination of, for example, cadmium selenide (CdSe), cadmium selenide/zinc sulfide (CdSe/ZnS), cadmium telluride (CdTe) and cadmium sulfide (CdS) as semiconductor nanoparticles. The ceramic fluorescent material may include, for example, yttrium (YAG) doped with cerium (Ce). The organic dye may include, for example, rhodamine or fluorescein. In FIG. 6, the fluorescent layers 292 are filled between the dielectric layers 291, but are not limited thereto. The dielectric layers 291 may be filled with a material other than a fluorescent material, for example, a material of the active layer 210.

The active layer 210 generates light by a driving signal (i.e., an electrical signal) applied to an electrode pair. The active layer 210 may include a quantum well structure that combines electrons and holes to generate light. The active layer 210 may be made of a III/V compound semiconductor made of Group III and Group V materials. The active layer 210 may include a resonant periodic gain (RPG) structure composed of a plurality of quantum wells and barrier layers between the quantum wells.

Quantum well layers and barrier layers are arranged in a multi-layer structure alternating with each other. Here, as the quantum well layer, a semiconductor material such as InxGa1-xAsyP1-y, InxGa1-xAs, InxGa1-xNyAs1-y, InxGa1-xAsySb (where 0.0<x<1.0, 0.0<y<1.0), etc. may be used. Values of x and y may be selected individually for each quantum well layer. A quantum dot of In(Ga)(N)As may be used instead of the quantum well layer.

Light that matches a resonance condition of the wavelength determining layer 290 from the light generated in the active layer 210 may be emitted to the outside. The light emitted from the light emitting array 122d may be determined by the resonance wavelength $\lambda_1$, $\lambda_2$ or $\lambda_3$ of the wavelength determining layer 290, and the resonance wavelength $\lambda_1$, $\lambda_2$ or $\lambda_3$ may be determined by a thickness of the wavelength determining layer 290, an effective permittivity of the wavelength determining layer 290, for example, a refractive index or dielectric constant of each material (the fluorescent layer 292 and the dielectric layer 291), the pitch P of the dielectric layer 291, etc. In FIG. 6, the pitch P of the dielectric layer 291 may be arranged to continuously change in the longitudinal direction X of the substrate 121. Thus, the light emitting array 122d may continuously emit changing light of a central wavelength in the longitudinal direction X of the substrate 121.

Figure 7:
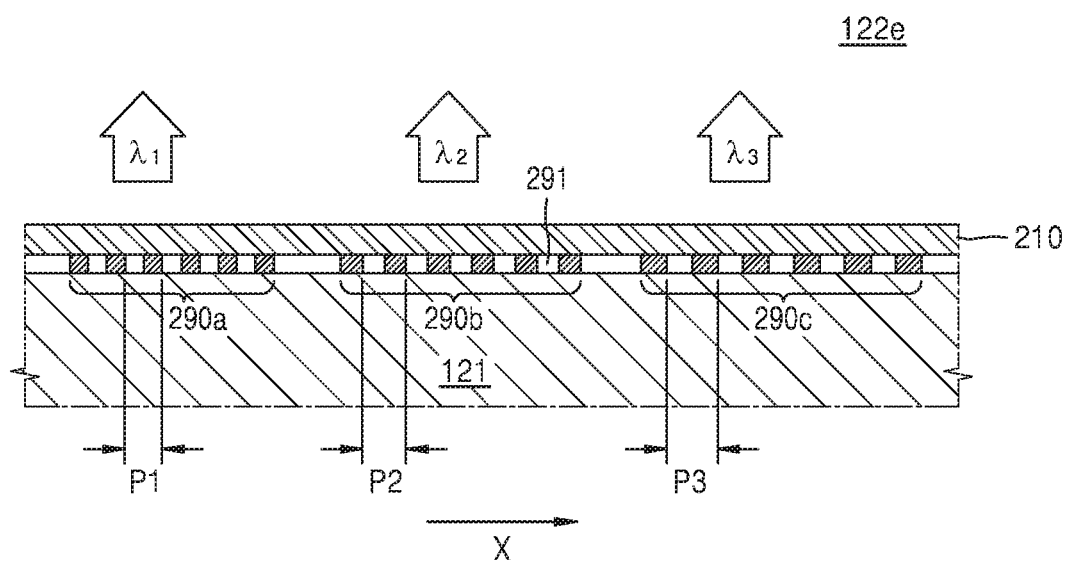
FIG. 7 is a diagram showing an example of a light emitting array including a discontinuous pattern structure, according to embodiments.

FIG. 7 is a diagram showing an example of a light emitting array 122e including a discontinuous pattern structure according to embodiments. As shown in FIG. 7, the light emitting array 122e may include the wavelength determining layer 290 of the discontinuous pattern structure. For example, the wavelength determining layer 290 may include a first wavelength determining layer 290a including dielectric layers are apart by a first pitch P1, a second wavelength determining layer 290b including dielectric layers are apart by a second pitch P2 different from the first pitch P1, and a third wavelength determination layer 290c including dielectric layers are apart by a third pitch P3 different from the first and second pitches P1 and P2. Thus, the first to third wavelength determining layers 290a, 290b, and 290c may emit light of different wavelengths $\lambda_1$, $\lambda_2$ and $\lambda_3$ to the outside. In FIGS. 6 and 7, wavelengths $\lambda_1$, $\lambda_2$ and $\lambda_3$ emitted according to pitches are different, but are not limited thereto. The wavelength $\lambda_1$, $\lambda_2$ or $\lambda_3$ of the emitted light may also be adjusted by the thickness or the effective permittivity of the wavelength determining layer 290.

Figure 8:
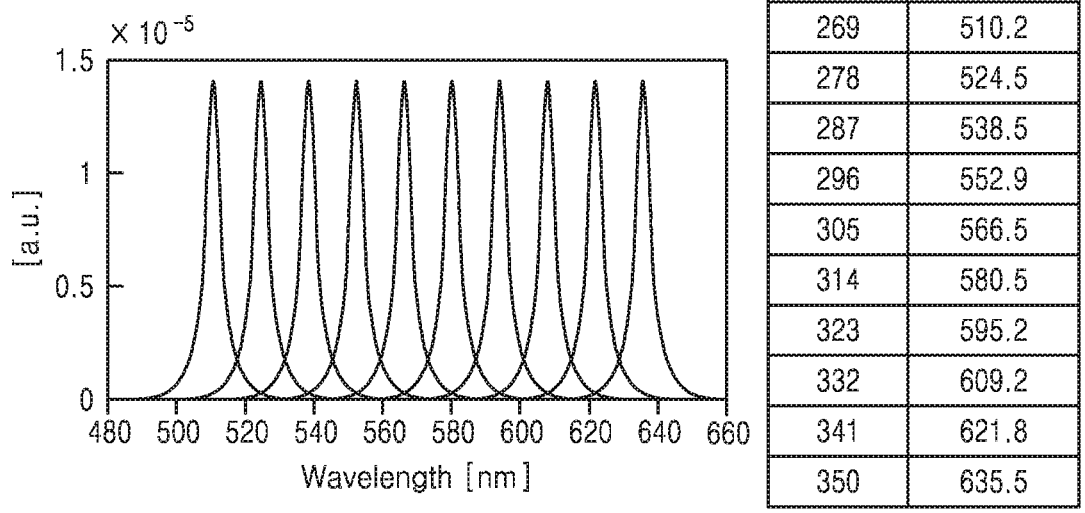
FIG. 8 is a diagram showing an emission wavelength of a dielectric layer for each pitch, according to embodiments.

FIG. 8 is a diagram showing an emission wavelength of the dielectric layer 291 for each pitch, according to embodiments. As shown in FIG. 8, it may be seen that a central wavelength of an emitted light varies according to a size of a pitch P of a wavelength determining layer. It may be seen that as the pitch P increases, the central wavelength of the emitted light increases.

Referring back to FIG. 1, the controller 160 applies a driving signal (e.g., an electrical signal) to each of the light emitting devices 200 such that light is emitted from the light emitting device 200. The controller 160 may control the light emitting device 200 to emit differently modulated light when the light emitting device 200 emits light. For example, the controller 160 may modulate the light emitted from each of the light emitting devices 200 by modulating a waveform of the driving signal applied to each of the light emitting devices 200 differently. Thus, each of the light emitting devices 200 may emit light of different waveforms. For example, the waveform of the driving signal may include any one or any combination of a sine wave, a square wave, a triangle wave, a pulse wave, and a sawtooth wave. The controller 160 may modulate the emitted light by modulating the frequency, amplitude, phase, etc. of the driving signal. The controller 160 may modulate the light with a driving signal having a different period even if the waveform is the same.

Figure 9:
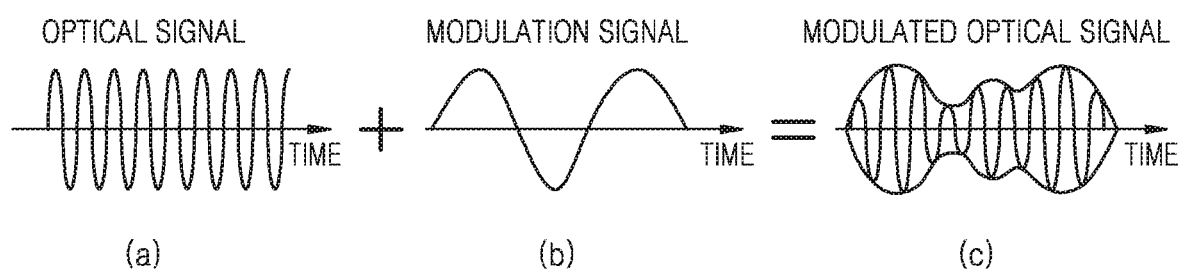
FIG. 9 is a reference diagram for explaining an example in which light emitted from a light emitting device is modulated, according to embodiments.

FIG. 9 is a reference diagram for explaining an example in which light emitted from the light emitting device 200 is modulated, according to embodiments. Portion (a) of FIG. 9 is an optical signal, and portion (b) of FIG. 9 is a modulation signal modulating magnitude as a modulation signal applied to a driving signal. When the driving signal including the modulation signal of portion (b) is applied to the light emitting device 200, a modulated optical signal shown in portion (c) of FIG. 9 may be output. Thus, the controller 160 applies the differently modulated driving signal to each light emitting device 200, and thus the light emitting array 122 may output differently modulated light for each wavelength.

Referring again to FIG. 1, the controller 160 may control the light emitting devices 200 such that the light emitting devices 200 arranged in one direction emit light having waveforms having sequentially changing degrees of waveform. Thus, the waveform correlation of lights emitted from the light emitting devices 200 that are adjacent to each other in the light emitting array 122 may be greater than the waveform correlation of lights emitted from the light emitting device 200 that are not adjacent to each other but is not limited thereto. The controller 160 may apply the driving signal to the light emitting array 122 such that the waveform correlation of the lights emitted from the light emitting devices 200 that are adjacent to each other in the light emitting array 122 is smaller than the waveform correlation of the lights emitted from the light emitting device 200 that are not adjacent to each other. Here, the waveform correlation is a value indicating whether the waveforms are similar. The larger the waveform correlation, the more similar the waveforms are.

The controller 160 may control the light emitting devices 200 included in the light emitting array 122 to simultaneously emit light, but is not limited thereto. The controller 160 may control the light emitting devices 200 to sequentially emit light one by one. Alternatively, the controller 160 may control the light emitting array 122 such that some light emitting devices 200 simultaneously emit light and the remaining light emitting devices 200 emit light sequentially at a different time. Alternatively, the light emitting array 122 may be controlled such that all the light emitting devices 200 included in the light emitting array 122 emit light or only some light emitting devices 200 emit light according to the target object 10.

The controller 160 modulates the emitted light by modulating the driving signal into the modulated signal when outputting the light of the light emitting array 122, but is not limited thereto. The light transmitting end 120 may further include a separate optical modulator, and the controller 160 may modulate the emitted light by controlling the optical modulator.

The light receiving end 140 may include a light detector 141 that detects light incident from the target object 10 and a processor 142 that obtains information about the target object 10 using a result detected by the light detector 141.

The light detector 141 may detect the light incident from the target object 10. The light may be light that has passed through the target object 10, and may be light scattered or reflected by the target object 10. The light detector 141 may include two-dimensionally arranged pixels. Each pixel may receive incident light and convert the light into an electrical signal, and may include a photo detector such as a photodiode and one or more transistors to activate each photo detector. The light detector 141 may be an image sensor. For example, the light detector 141 may include either one or both of a charge coupled device (CCD) and a complementary metal-oxide semiconductor (CMOS).

The processor 142 may classify intensity of the detected light using Fourier transformation according to modulation signals. A modulation signal may correspond to a wavelength emitted by the light emitting array 122. Thus, the processor 142 may obtain the information about the target object 10 by using detection results classified according to modulation signals, that is, by using detection results according to wavelengths. The information about the target object 10 may be physical property information. Here, the target object 10 may be a person or an animal but is not limited thereto. The target object 10 may be part included in the target object 10, or may be an environmental sample, food, etc. for the water quality management or soil management.

Figure 10:
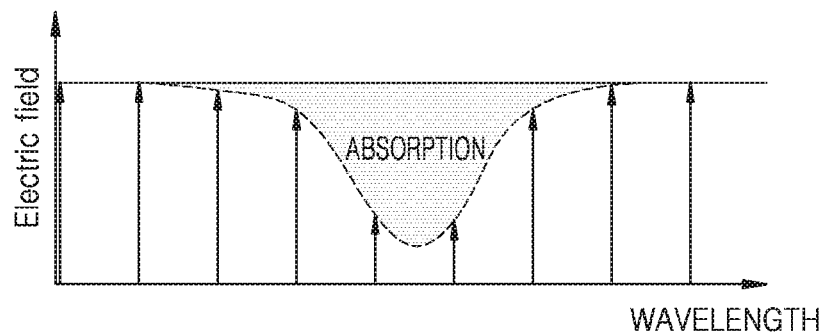
FIG. 10 is a graph showing intensity of light detected by a light detector for each wavelength, according to embodiments.

FIG. 10 is a graph showing intensity of light detected by the light detector 141 for each wavelength according to embodiments. Even though the light emitting array 122 emits light having the same intensity for each wavelength, the light detector 141 may detect the intensity of the light for each wavelength as shown in FIG. 10. This is because the target object 10 has different characteristics of absorbing light for each wavelength. Thus, information about the target object 10 may be obtained from the intensity of the light detected for each wavelength.

Referring again to FIG. 1, the processor 142 may classify the detected intensity of the light using Fourier transformation according to modulation signals, but is not limited thereto. The light detector 141 may be driven by a driving signal corresponding to the driving signal of a light emitting array.

The light detector 141 may include a plurality of sub-detectors 300 arranged one-dimensionally or two-dimensionally.

Figure 11:
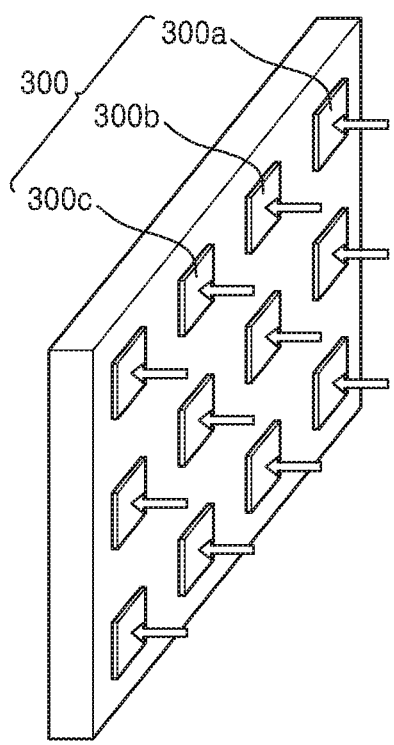
FIG. 11 is a diagram illustrating a light detector including a plurality of sub-detectors, according to embodiments.

FIG. 11 is a diagram illustrating a light detector 141a including the plurality of sub-detectors 300, according to embodiments. Each of the sub-detectors 300 may include one or more pixels. The number of the sub-detectors 300 may be the same as the number of the light emitting devices 200 but is not limited thereto. The number of the sub-detectors 300 may be greater than the number of the light emitting devices 200.

Each sub-detector 300 may detect light having a waveform. For example, a first sub-detector 300a may detect a first light having a first waveform, a second sub-detector 300b may detect a second light having a second waveform, and a third sub-detector 300c man detect a third light having a third waveform. As described above, a waveform of the light detected by each of the sub-detectors 300 may be determined by a driving signal applied to each of the sub-detectors 300.

The controller 160 may control the light detector 141 such that the light detector 141 may detect the light. The controller 160 may drive the light detector 141 in a unit of the sub-detectors 300 and may drive the light detector 141 by a driving signal corresponding to the driving signal for driving the light emitting array 122. For example, when an optical driver drives the first light emitting device 200 by a first driving signal having the first waveform, the controller 160 may drive the first sub-detector 300 corresponding to the first light emitting device 200 by a second driving signal corresponding to the first driving signal. Because the first driving signal and the second driving signal are the same or highly similar, and thus the first driving signal and the second driving signal may be coupled. The second drive signal of the first sub-detector 300 may be coupled to the light generated by the first drive signal to detect light. Thus, each sub-detector 300 may detect the light of the driving signal for each waveform. By detecting light of a wavelength by coupling as described above, noise may be easily removed by external light or light having a different wavelength. A band filter for detecting light of a wavelength is fixed in a manufacturing process while the driving signal applied to the light detector 141 is easily controlled by the controller 160 and the waveform of the driving signal is also changed for each sub-detector 300. The light of the same wavelength may be detected by the more various sub-detectors 300.

The optical apparatus as described above may spatially separate and emit a plurality of lights having different wavelengths and modulations. Because the optical apparatus separates detection results for each wavelength based on modulation, it is not necessary to have a hardware filter for detecting a wavelength.

Figure 12:
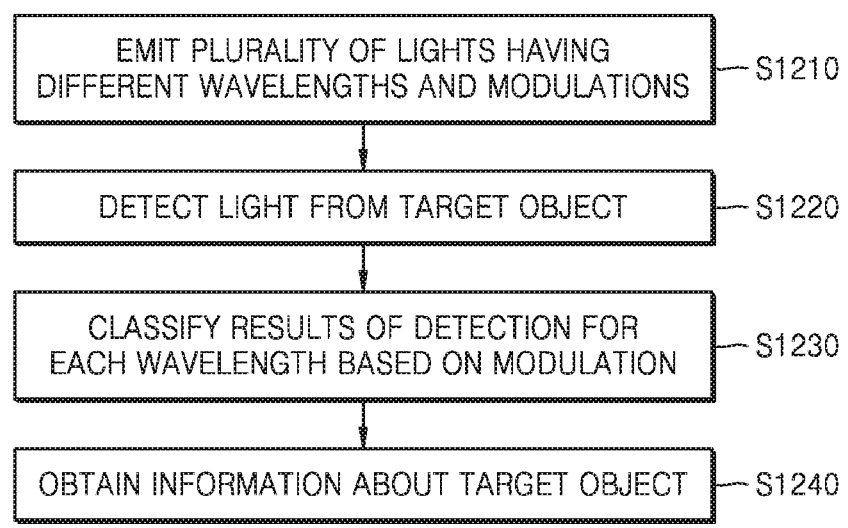
FIG. 12 is a flowchart illustrating an operation method of an optical apparatus, according to embodiments.

FIG. 12 is a flowchart illustrating an operation method of an optical apparatus, according to embodiments.

In operation S1210, the light transmitting end 120 may emit a plurality of lights having different wavelengths and modulations. The light transmitting end 120 may include the substrate 121 and the plurality of light emitting devices 200 arranged monolithically on the substrate 121 and emitting light having different wavelengths. Each of the light emitting devices 200 may include a laser or a LED and is not limited to a specific example.

Each of the light emitting devices 200 of the light emitting array 122 may emit light having a narrow wavelength bandwidth, and an interval between central wavelengths of the light emitting devices 200 may be greater than the wavelength bandwidth. Thus, the light emitted from the light emitting array 122 may be discontinuous light, for example, comb-type light. For example, each of the light emitting devices 200 may emit light having a bandwidth of less than about 15 nm, and the interval between the central wavelengths may be greater than or equal to about 0.5 nm and less than or equal to about 30 nm.

The controller 160 applies a driving signal (e.g., an electrical signal) to each of the light emitting devices 200 such that light is emitted from the light emitting device 200. The controller 160 may control the light emitting device 200 to emit differently modulated light when the light emitting device 200 emits light. For example, the controller 160 may modulate the light emitted from each of the light emitting devices 200 by modulating a waveform of the driving signal applied to each of the light emitting devices 200 differently. Thus, each of the light emitting devices 200 may emit light of different waveforms. For example, the waveform of the driving signal may include any one or any combination of a sine wave, a square wave, a triangle wave, a pulse wave, and a sawtooth wave. The controller 160 may modulate the emitted light by modulating the frequency, amplitude, phase, etc. of the driving signal. The controller 160 may modulate the light with a driving signal having a different period even if the waveform is the same.

The controller 160 may control the light emitting devices 200 included in the light emitting array 122 to simultaneously emit light, but is not limited thereto. The controller 160 may control the light emitting devices 200 to sequentially emit light one by one. Alternatively, the controller 160 may control the light emitting array 122 such that some light emitting devices 200 simultaneously emit light and the remaining light emitting devices 200 emit light sequentially at a different time. Alternatively, the light emitting array 122 may be controlled such that all the light emitting devices 200 included in the light emitting array 122 emit light or only some light emitting devices 200 emit light according to the target object 10.

The controller 160 modulates the emitted light by modulating the driving signal into the modulated signal when outputting the light of the light emitting array 122 but is not limited thereto. The light transmitting end 120 may further include a separate optical modulator, and the controller 160 may modulate the emitted light by controlling the optical modulator.

In operation S1220, the light detector 141 of the light receiving end 140 may detect the light incident from the target object 10. The light may be light that has passed through the target object 10, and may be light scattered or reflected by the target object 10. The light detector 141 may include two-dimensionally arranged pixels. Each pixel may receive incident light and convert the light into an electrical signal, and may include a photo detector such as a photodiode and one or more transistors to activate each photo detector. The light detector 141 may be an image sensor. For example, the light detector 141 may include either one or both of a charge coupled device (CCD) and a complementary metal-oxide semiconductor (CMOS).

In operation S1230, the processor 142 may classify results of the detection for each wavelength based on the modulation. For example, the processor 142 may classify intensity of the detected light using Fourier transformation according to modulation signals. A modulation signal may correspond to a wavelength emitted by a light emitting array one by one. Thus, the processor 142 may classify the detection results for each wavelength based on a modulation signal.

Alternatively, the light detector 141 may detect light for each wavelength based on the modulation. The light detector 141 may include the sub-detector 300 arranged one-dimensionally or two-dimensionally. Each sub-detector 300 may detect light having a waveform. The controller 160 may drive the light detector 141 in a unit of the sub-detectors 300 and may drive the light detector 141 by a driving signal corresponding to the driving signal for driving the light emitting array 122. For example, when an optical driver drives the first light emitting device 200 by a first driving signal having the first waveform, the controller 160 may drive the first sub-detector 300 corresponding to the first light emitting device 200 by a second driving signal corresponding to the first driving signal. Because the first driving signal and the second driving signal are the same or highly similar, and thus the first driving signal and the second driving signal may be coupled. The second drive signal of the first sub-detector 300 may be coupled to the light generated by the first drive signal to detect light. Thus, each sub-detector 300 may detect the light of the driving signal for each waveform.

In operation S1240, the processor 142 may obtain the information about the target object 10 by using the detection results classified according to modulation signals, that is, by using the detection results according to wavelengths. The information about the target object 10 may be physical property information. Here, the target object 10 may be a person or an animal. Because an absorption rate of light is different according to the physical property of the target object 10, the information about the target object 10 may be obtained by using the intensity of the detected light for each wavelength.

The optical apparatus described above may be disposed in one housing. An optical device may be of a transmissive type for detecting light transmitted through the target object 10, or may be of a reflective type for detecting light reflected by the target object 10.

Examples of the optical apparatus using multi-wavelength light include mobile phones, smart phones, laptop computers, tablet PCs, electronic book terminals, digital broadcast terminals, PDAs (personal digital assistants), portable multimedia players (PMPs), MP3 players, a digital camera, an Internet Protocol Television (IPTV), a digital television (DTV), a CE device (for example, a refrigerator having a display device, an air conditioner or the like), but is not limited thereto. The optical apparatus using multi-wavelength light described in this specification may be a wearable device that may be worn by a user.

The optical apparatus according to the embodiments does not need a hardware component for separating light for each wavelength because the optical apparatus emits a plurality of lights having different narrower bandwidths and different central wavelengths. Thus, miniaturization of the optical apparatus is possible. The optical apparatus may detect light of a wavelength based on a waveform, thereby obtaining information about a target object more accurately by various waveform modulations.

It may be understood that the embodiments described herein may be considered in a descriptive sense only and not for purposes of limitation. Descriptions of features or aspects within each embodiment may be considered as available for other similar features or aspects in other embodiments.

While the embodiments have been described with reference to the figures, it will be understood by those of ordinary skill in the art that various changes in form and details may be made therein without departing from the spirit and scope as defined by the following claims.

What is claimed is:

1. An optical apparatus using multi-wavelength light, the optical apparatus comprising:
   a substrate;
   a light emitting array disposed on the substrate, and comprising a plurality of light emitting devices emitting a plurality of lights having different wavelengths; and
   a controller configured to control the light emitting array such that each light from among the plurality of lights is modulated differently from each other light from among the plurality of lights and the plurality of lights are emitted simultaneously, wherein an interval between central wavelengths of lights emitted by adjacent light emitting devices from among the plurality of light emitting devices is greater than a wavelength bandwidth of each light from among the plurality of lights, and wherein the interval is greater than or equal to about 0.5 nm and less than or equal to about 30 nm.

2. The optical apparatus of claim 1, wherein the controller is further configured to modulate a waveform of a driving signal that is applied to the plurality of light emitting devices such that the plurality of lights having different waveforms are emitted.

3. The optical apparatus of claim 2, wherein any one or any combination of a frequency, an amplitude, and a phase of the driving signal is modulated.

4. The optical apparatus of claim 2, wherein the waveform of the driving signal comprises any one or any combination of a sine wave, a square wave, a triangle wave, and a pulse wave.

5. The optical apparatus of claim 1, wherein a first waveform correlation of first ones among the plurality of lights emitted from at least two among the plurality of light emitting devices that are adjacent to each other in the light emitting array is greater than a second waveform correlation of second ones among the plurality of lights emitted from at least two among the plurality of light emitting devices that are not adjacent to each other.

6. The optical apparatus of claim 1, wherein a first waveform correlation of first ones among the plurality of lights emitted from at least two among the plurality of light emitting devices that are adjacent to each other in the light emitting array is smaller than a second waveform correlation of second ones among the plurality of lights emitted from at least two among the plurality of light emitting devices that are not adjacent to each other.

7. The optical apparatus of claim 1, wherein the plurality of light emitting devices is two-dimensionally arranged on the substrate.

8. The optical apparatus of claim 1, wherein the plurality of light emitting devices is sequentially arranged in a first direction in the light emitting array, and emits the plurality of lights having sequentially changing wavelengths.

9. The optical apparatus of claim 1, wherein the wavelength bandwidth of each of the plurality of lights is less than about 15 nm.

10. The optical apparatus of claim 1, wherein any one or any combination of the plurality of light emitting devices is a laser or a light emitting diode (LED).

11. The optical apparatus of claim 1, wherein any one or any combination of the plurality of light emitting devices comprises:
an active layer disposed on the substrate and configured to generate light; and
a wavelength determining layer configured to emit one among the plurality of lights having one among the different wavelengths in the light generated by the active layer.

12. The optical apparatus of claim 11, wherein the one among the different wavelengths corresponds to either one or both of a thickness and a dielectric constant of the wavelength determining layer.

13. The optical apparatus of claim 11, wherein the active layer is disposed in the wavelength determining layer.

14. The optical apparatus of claim 11, wherein the wavelength determining layer comprises a grating pattern structure.

15. The optical apparatus of claim 14, wherein the wavelength determining layer comprises a plurality of dielectric layers that are spaced apart from each other in a longitudinal direction of the substrate.

16. The optical apparatus of claim 15, wherein a pitch of the plurality of dielectric layers continuously changes in the longitudinal direction of the substrate.

17. The optical apparatus of claim 15, wherein the plurality of dielectric layers comprises:
first dielectric layers arranged in a first pitch; and
second dielectric layers arranged in a second pitch different from the first pitch.

18. The optical apparatus of claim 1, wherein the light emitting array comprises:
an active layer disposed on the substrate and configured to generate light; and
a plurality of wavelength conversion layers disposed on the active layer and configured to emit the light generated by the active layer as the plurality of lights having the different wavelengths.

19. The optical apparatus of claim 18, further comprising a barrier disposed on the active layer and configured to separate the plurality of wavelength conversion layers.

20. The optical apparatus of claim 1, further comprising:
a light detector configured to detect light that is at least one among scattered, transmitted and reflected by a target object to which the plurality of lights are emitted by the light emitting array; and
a processor configured to obtain information about the target object, using the light detected by the light detector.

21. The optical apparatus of claim 20, wherein the light detector comprises an image sensor.

22. The optical apparatus of claim 20, wherein the processor is further configured to:
classify the light detected by the light detector for each wavelength of the plurality of lights emitted by the light emitting array; and
obtain the information about the target object, using the classified light for each wavelength.

23. An operation method of an optical apparatus comprising a plurality of light emitting devices, the operation method comprising:
emitting, by the plurality of light emitting devices, a plurality of lights such that each light from among the plurality of lights has a different wavelength and a different modulation from each other light from among the plurality of lights;
detecting light that is at least one among scattered, reflected and transmitted by a target object to which the plurality of lights are emitted by the plurality of light emitting devices;
classifying the detected light for each wavelength, based on the modulations of the plurality of lights; and
obtaining information about the target object, using the classified light for each wavelength,
wherein an interval between central wavelengths of lights emitted by adjacent light emitting devices from among the plurality of light emitting devices is greater than a wavelength bandwidth of each light from among the plurality of lights, and
wherein the interval is greater than or equal to about 0.5 nm and less than or equal to about 30 nm.

24. The operation method of claim 23, wherein the wavelength bandwidth of each of the plurality of lights is less than about 15 nm.

25. An optical apparatus comprising:
a substrate;
an active layer disposed on the substrate and configured to generate a first light; and
a wavelength determining layer disposed on the active layer and comprising a plurality of portions, each portion from among the plurality of portions configured to emit a respective light having a wavelength different from respective wavelengths of each other portion from among the plurality of portions; and
a controller configured to control the active layer such that each respective light from among the plurality of lights is modulated differently from each other light from among the plurality of lights,
wherein an interval between central wavelengths of lights emitted by adjacent light emitting devices from among the plurality of light emitting devices is greater than a wavelength bandwidth of each light from among the plurality of lights, and
wherein the interval is greater than or equal to about 0.5 nm and less than or equal to about 30 nm.

* * * * *